United States Patent [19]

Konushi et al.

[11] Patent Number: 5,011,550

[45] Date of Patent: Apr. 30, 1991

[54] LAMINATED STRUCTURE OF COMPOUND SEMICONDUCTORS

[75] Inventors: Fumihiro Konushi; Akinori Seki; Jun Kudo; Masayoshi Koba, all of Nara, Japan

[73] Assignee: Sharp Kabushiki Kaisha, Osaka, Japan

[21] Appl. No.: 193,400

[22] Filed: May 12, 1988

[30] Foreign Application Priority Data

| May 13, 1987 | [JP] | Japan | 62-117575 |
| Jul. 6, 1987 | [JP] | Japan | 62-169162 |
| Dec. 3, 1987 | [JP] | Japan | 62-306185 |

[51] Int. Cl.$^5$ ............................................. H01L 21/20
[52] U.S. Cl. ................................. 148/33.5; 148/33.4; 437/131; 437/132
[58] Field of Search ............... 437/132, 81; 148/33.1, 148/33.2, 33.3, 33.4, 33.5

[56] References Cited

U.S. PATENT DOCUMENTS

| 3,766,447 | 10/1973 | Mason | 437/132 |
| 4,180,825 | 12/1979 | Mason | 437/132 |
| 4,632,712 | 12/1986 | Far et al. | 437/81 |

FOREIGN PATENT DOCUMENTS

| 2069234 | 8/1981 | Japan | 437/132 |
| 0053927 | 3/1982 | Japan | 437/132 |
| 0053928 | 3/1982 | Japan | 437/132 |
| 6012724 | 7/1983 | Japan . | |
| 16021888 | 11/1985 | Japan . | |
| 0026211 | 2/1986 | Japan | 437/132 |
| 16126216 | 2/1986 | Japan . | |
| 16170715 | 4/1986 | Japan . | |
| 0189620 | 8/1986 | Japan | 437/132 |
| 0189621 | 8/1986 | Japan | 437/132 |
| 0001224 | 1/1987 | Japan | 437/132 |
| 0088317 | 4/1987 | Japan | 437/132 |

OTHER PUBLICATIONS

Yamamoto et al., *Optoelectronics–Devices and Technologies*, vol. 1, No. 1, pp. 41–49 (Jun. 1986).
Lee et al., *Appl. Phys. Lett.* 50(24), pp. 1725–1726 (Jun. 1987).
IEEE Electron Device Letters, vol. EDL-2, No. 7, Jul. 1981, pp. 169–171.
J. Appl. Phys. 57(10), May 15, 1985, pp. 4578–4582.
Appl. Phys. Lett. 48(25), Jun. 23, 1986, pp. 1713–1715.
Japanese Journal of Applied Physics, vol. 25, No. 4, Apr. 1986, pp. L297–L298.
Lee et al.,"Characterization of . . . " Appl. Phys. Lett. 52(11) 3/14/88, pp. 880–882.
Seki et al., "MOCVD Growth . . . " JPN J. Appl. Phys. Lett. 10/87, pp. L1587–L9158.
Lee et al., "Heteroepitaxial Growth of InP Directly on Si by Low Pressure Metalorganic Chemical Vapor Deposition" Appl. Phys. Lett. 50(24) Jun. 15, 1987, pp. 1725–1726.
Appl. Phys. Lett. 48(18), May 5, 1986, pp. 1223–1225.

*Primary Examiner*—Brian E. Hearn
*Assistant Examiner*—Tuan Nguyen
*Attorney, Agent, or Firm*—Irell & Manella

[57] ABSTRACT

A laminated structure of compound semiconductors comprising a IV semiconductor underlying substrate, a first III-V compound semiconductor layer that is formed as an intermediate layer on the IV compound semiconductor underlying substrate, and a second III-V compound semiconductor layer that is formed on the intermediate layer, wherein the thermal expansion coefficients of the IV compound semiconductor underlying substrate, $E_{ts}$, the first III-V compound semiconductor layer, $E_{t1}$, and the second III-V compound semiconductor layer, $E_{t2}$, have the following relationship: $E_{t1} > E_{t2} > E_{ts}$.

6 Claims, 1 Drawing Sheet

LAMINATED STRUCTURE OF COMPOUND SEMICONDUCTORS

BACKGROUND OF THE INVENTION

1. Field of the Invention

This invention relates to a laminated structure of compound semiconductors that comprises a IV semiconductor underlying substrate and III-V compound semiconductor layers on the IV semiconductor underlying substrate. More particularly, it relates to a laminated structure of compound semiconductors that attains a reduction of crystal defects in an InP epilayer formed over a Si underlying substrate.

2. Description of the Prior Art

In recent years, thin crystal film growth methods have been remarkably developed by which laser diodes, solar batteries, and high speed devices using two dimensional electron gases, or the like have been produced. However, since these devices are produced by the use of a III-V compound semiconductor as a substrate, their production cost becomes high and the substrate becomes brittle. Moreover, because of difficulties in the growth of crystals, it is difficult to obtain a large-area substrate.

To solve these problems, the heteroepitaxial growth of III-V compound semiconductor on a IV semiconductor underlying substrate has been studied, especially a GaAs thin crystal film is grown on a Si underlying substrate, resulting in a large-area substrate with an excellent crystal quality and low cost. For these conventional crystal film growth methods of GaAs on Si, there are the following three methods, one of which is a two-step growth method in which a GaAs thin film is grown on a Si underlying substrate, first, at a low temperature and then a GaAs film is further grown on the said GaAs thin film at a high temperature (Japanese Laid-Open Patent Publication No. 61-70715), another of which is a method in which a Ge intermediate layer is used between the Si underlying substrate and the GaAs film (IEEE Electron Device Lett. EDL-2, 169 (1981)), and the other is a method in which alternate layers composed of a III-V compound semiconductor (e.g., GaAs) and another III-V group compound semiconductor with a lattice constant that is similar to that of GaAs are used as an intermediate layer disposed between the Si underlying substrate and the GaAs film. By these conventional thin film growth method, field effect transistors, light-emitting diodes, semiconductor laser devices, etc., have been fabricated on an experimental basis. Recently, an excellent crystal quality GaAs thin film has been formed by the use of a strained layer superlattice of InGaAs/GaAs, by which excellent device characteristics are obtainable (Appl. Phys. Lett., 48 (1986) 1223).

Since InP, one of the III-V compound semiconductors that have an electron saturation velocity higher than that of GaAs and that have a thermal conductivity greater than that of GaAs, is used instead of GaAs, a microwave power amplifier device that operates at a higher frequency than that with use of GaAs and that produces high output power will be obtainable.

On the other hand, a bulk InP substrate is more expensive than a bulk GaAs substrate, and moreover the InP substrate cannot attain a large crystal area (an area with a diameter of two inches is the largest that has been obtained). Also, crystal quality of InP that are available on the market have a crystal defect density of as great as about $10^4 \, cm^{-2}$. To overcome these problems, a crystal layer growth method by which an InP layer is grown on a Si underlying substrate has been studied. However, the crystal quality of the InP layer is not yet sufficient and the InP/Si structure is not yet applicable to a device as a substrate, because a difference in the lattice constant between Si and InP is 8.1% and that is about two times that of a difference in the lattice constant between Si and GaAs and because the dissociation pressure of InP is so high that P is liable to be released during the growth of InP and the surface morphology of the InP layer deteriorates, which causes difficulties in an improvement of the crystal quality of the InP layer.

None of the conventional crystal growth methods can reduce not only the large lattice-mismatch between the underlying substrate and the crystal epilayer, but also the stress of the crystal epilayer, and therefore, a high quality crystal layer cannot be formed with reproducibility.

SUMMARY OF THE INVENTION

The laminated structure of compound semiconductors of this invention, which overcomes the above-discussed and numerous other disadvantages and deficiencies of the prior art, comprises a IV semiconductor underlying substrate, a first III-V compound semiconductor layer that is formed as an intermediate layer on said IV compound semiconductor underlying substrate, and a second III-V compound semiconductor layer that is formed on said intermediate layer, wherein the thermal expansion coefficients of said IV compound semiconductor underlying substrate, $E_{ts}$, said first III-V compound semiconductor layer, $E_{t1}$, and said second III-V compound semiconductor layer, $E_{t2}$, have the following relationship: $E_{t1} > E_{t2} > E_{ts}$.

In a preferred embodiment, the IV compound semiconductor underlying substrate is made of Si, said first III-V compound semiconductor layer is made of GaAs, and said second III-V compound semiconductor layer is made of InP.

In a preferred embodiment, the above-mentioned laminated structure further comprises a third III-V compound semiconductor layer that is formed on said second III-V compound semiconductor layer, said third III-V compound semiconductor being composed of a plurality of alternate layers consisting of compound semiconductor thin layers made of the same compound semiconductor as said second III-V compound semiconductor layer and III-V compound semiconductor thin layers made of a compound semiconductor different from that of said second III-V compound semiconductor layer; and a fourth compound semiconductor layer that is formed on said third III-V compound semiconductor layer.

In a preferred embodiment, the third III-V compound semiconductor layer is composed of a plurality of alternate layers consisting of $InAs_xP_{1-x}$ ($0 < x < 1$) thin layers and InP thin layers, and said fourth III-V compound semiconductor layer is made of InP.

In a preferred embodiment, the third III-V compound semiconductor layer is composed of alternate layers consisting of about thirty or less $InAs_xP_{1-x}$ layers and InP layers with a thickness of about 100 nm or less each.

In a preferred embodiment, the first III-V compound semiconductor layer and the second III-V compound semiconductor layer that is formed on said first III-V compound semiconductor layer, respectively, contain a compound semiconductor layer with a thickness of 1000 Å or less that is formed at a low temperature of 300°–450° C.

The GaAs intermediate layer is grown on the Si underlying substrate by a conventional crystal growth method. At that time, the GaAs layer undergoes a tensile thermal stress based on the fact that the thermal expansion coefficient of GaAs is greater than that of Si. Moreover, since the relationship of the thermal expansion coefficient among Si, GaAs and InP is GaAs>InP->Si, the InP layer that is directly formed on the GaAs layer undergoes a compressive thermal stress from the GaAs layer whereas it undergoes a tensile thermal stress from the Si underlying substrate, and accordingly the thermal stress of the III-V group compound semiconductor epilayer that is disposed on the top of the said laminated structure can be reduced by selecting the optimum thickness of the GaAs intermediate layer and the optimum growth conditions. In this way, when the aimed InP epilayer is formed on the Si underlying substrate, if a GaAs layer is used as an intermediate layer positioned between the Si underlying substrate and the InP epilayer, the lattice-mismatch therebetween and the thermal stresses arising therebetween will be reduced and a laminated structure that is provided with an InP epilayer having an excellent smooth surface and an excellent crystal quality will be obtained.

Moreover, when a conventional strained-layer superlattice is applied to InP, the overlaid InP layer puts a stress upon the underlying InP to thereby bend and/or terminate the crystal defects of the underlying InP layer, so that the crystal defects of the said underlying InP layer that have been located at the surface of the underlying InP layer can be reduced. In this way, a high quality InP epilayer can be formed.

When alternate layers that are composed of $InAs_xP_{1-x}$ ($x \approx 0.01$–0.20) layers (the lattice constant of the said compound semiconductor being greater than that of InP) and InP layers are used as an underlying layer on which an InP epilayer is formed, an $InAs_xP_{1-x}$ layer puts a tensile stress upon the adjacent InP layer having a compressive stress because of the following relationship of the lattice-mismatch among Si, GaAs, InP, and InAsP: $d_{Si} < d_{GaAs} < d_{InP} < d_{InAsP}$, thereby attaining a decrease in the internal stress of the said InP layer. Although it is possible to use $In_xGa_{1-x}As$ instead of $InAs_xP_{1-x}$, when P is removed during the growth of InGaAs on the InP layer, the disorder of the InP layer arises at the interface between the InP layer and the InGaAs layer, which causes deterioration of the quality of the InP epilayer. For this reason, the use of alternate layers of $InAs_xP_{1-x}$/InP are effective for the purpose of this invention.

There will be a possibility that when the alternate layers of $InAs_xP_{1-x}$/InP are formed, crystal defects arise in these layers because of the lattice-mismatch between the alternate layers, which causes difficulties in obtaining a high quality crystal epilayer. Accordingly, it is necessary to select the optimum alternate-layer growth conditions (such as growth temperatures, x values, layer thicknesses, the number of alternate layers, growth rates, etc.).

The value of x is set to be preferably about 0.1 or less. The thickness of each of the alternate layers is set to be preferably about 100 Å or less, more preferably about 10–20 Å. The number of alternate layers is set to be preferably about 30 or less.

In producing or after producing the above-mentioned laminated structure of compound semiconductors, it is preferable that the laminated structure is heat-treated at a temperature that is higher by about 100°–250° C. than the temperature at which the laminated structure is formed, so that the crystal defects of the InP epilayer located on the top surface of the said laminated structure can be further reduced, resulting in a higher quality InP epilayer. Since the said laminated structure is formed by the use of a Si substrate, it can be provided with a large crystal area and it is produced at a low cost. Moreover, the laminated structure is advantageous over a conventional bulk InP substrate in that the laminated structure is superior in mechanical strength, thermal conductivity or the like.

Thus, the invention described herein makes possible the objectives of (1) providing a laminated structure of compound semiconductors that has a very smooth and excellent crystal quality epilayer; (2) providing a laminated compound semiconductor structure with a high quality that is produced at a low cost; (3) providing a laminated compound semiconductor structure that has a large crystal area; and (4) providing a laminated compound semiconductor structure that is easily handled when it is used as a substrate for the production of a variety of devices such as laser diodes, FETs, etc.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
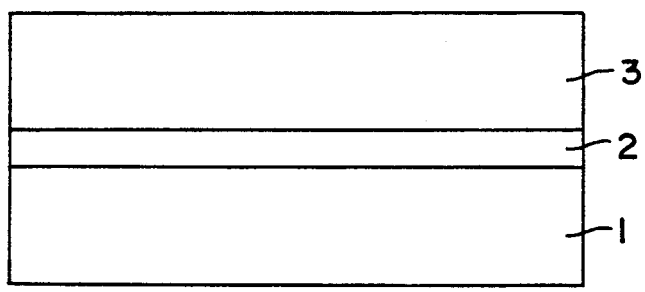
FIG. 1 is a sectional view showing a laminated structure of compound semiconductors of this invention.

FIG. 1 shows a laminated structure of compound semiconductors of this invention, which comprises a IV semiconductor (Si) underlying substrate 1, a first III-V compound semiconductor (GaAs) layer 2 that is disposed as an intermediate layer on the IV semiconductor underlying substrate 1, a second III-V compound semiconductor (InP) layer 3 that is disposed on the first III-V semiconductor layer 2. This laminated structure was produced as follows: On a Si underlying substrate 1, a single domain GaAs layer 2 having a thickness ranging from 0.02 to 1.0 μm was formed by metalorganic chemical vapor deposition (MOCVD), molecular beam epitaxy (MBE), vapor phase epitaxy (VPE) using a chloride-halide system, or the like in a reaction chamber. Then, an InP layer 3 having a thickness ranging from 0.5 to 10 μm was formed on the GaAs layer 2 within the same chamber. More particularly, both the GaAs layer 2 and the InP layer 3 were formed in a low pressure MOCVD.

The production process of the laminated structure of this example is described in detail below: A (100) oriented Si underlying substrate was subjected to an HF etching treatment and the Si underlying substrate was preannealed at 1000° C. for 10 minutes in an AsH₃ atmosphere within a growth furnace. Then, a GaAs intermediate layer 2 with a thickness of 0.02-1.0 μm was grown on the Si underlying substrate 1 by the use of triethylgallium (TEG) and arsine (AsH₃) (wherein the ratio of the V group gas to the III group gas being 100 and the growth temperature being 400°-700° C.), and an InP layer 3 with a thickness of 0.5-10 μm was grown on the GaAs intermediate layer 2 by the use of trimethylindium (TMI) and phosphine (PH₃) (wherein the ratio of the V group gas to the III group gas being 70-200 and the growth temperature being 400°-650° C.).

The lattice constants of the layers of this laminated structure shown in FIG. 1 are 5.431 Å for Si, 5.642 Å for GaAs, and 5.868 Å for InP. The lattice mismatch between Si and InP is so large, 8.1%, that if the InP epilayer is directly grown on the Si substrate, the surface of the InP layer will not be smooth and there will be a number of dislocations in the said grown layer, causing an inferior crystal quality. On the other hand, the lattice constant of GaAs lies between the lattice constants of Si and InP. The lattice mismatch between GaAs and Si is 4.1% and the lattice mismatch between GaAs and InP is 4.0%. Moreover, Si and GaAs are adapted to each other and GaAs and InP are also adapted to each other, so that when a GaAs layer is used for an intermediate layer disposed between the Si substrate and the InP epilayer, the InP epilayer can be provided with an excellent smooth surface and an excellent crystal quality.

Table 1 indicates a difference between the near band emission peak of the InP layer of each of the heteroepitaxial Structures (a, c and d) in the photoluminescence spectrum and the near band emission peak of a bulk InP substrate in the photoluminescence spectrum. Table 1 also indicates, as a reference, a difference between the near band emission peak of the GaAs layer of the heteroepitaxial Structure b in the photoluminescence spectrum and the near band emission peak of a bulk GaAs substrate in the photoluminescence spectrum.

TABLE 1

| Epitaxially grown layer structures | Near band emission peak difference in photoluminescence spectrum between the InP layer and the bulk Inp substrate | Stress of grown films |
| --- | --- | --- |
| (a) InP/GaAs/Si (Thickness of 0.1 μm) | −3 | tensile |
| (c) InP/Si (Growth temperature of 600° C.) | −7 | tensile |
| (d) InP/GaAs (Growth temperature of 600° C.) | +4 | compressive |
| (b) GaAs/Si (Growth temperature of 700° C.) | −27 | tensile |

Table 1 indicates that the InP epilayer grown on the GaAs intermediate layer formed on the Si underlying substrate of this invention (Structure a), the GaAs layer grown on the Si underlying substrate (Structure b) and the InP layer grown on the Si underlying substrate (Structure c) undergo a tensile stress, respectively, whereas the InP layer grown on the GaAs underlying substrate (Structure d) undergoes a compressive stress. The reasons why these layers strain in this way are as follows: The thermal expansion coefficients of Si, GaAs and InP, respectively, are $2.6 \times 10^{-6}$/deg., $5.9 \times 10^{-6}$/deg, and $4.5 \times 10^{-6}$/deg. The GaAs layer (Structure b) and the InP layer (Structure c) that are directly disposed on the Si underlying substrate undergo a tensile stress because the thermal expansion coefficients of GaAs and InP are greater than that of Si, whereas the InP layer (Structure d) that is disposed on the GaAs underlying substrate undergoes a compressive stress because the thermal expansion coefficient of InP is smaller than that of GaAs. On the contrary, with Structure a of this example, although the InP layer 3 undergoes a tensile stress from the Si underlying substrate 1, it undergoes a compressive stress from the GaAs intermediate layer 2 at the same time. When the GaAs intermediate layer 2 with a thickness of 0.1 μm is grown, the tensile stress that is undergone by the InP layer 3 becomes $0.8 \times 10^9$ dyn/cm² that is one half times or less the tensile stress that is undergone by the InP layer 3 at the time when the InP layer is directly grown on the Si underlying substrate. Thus, by selecting the optimum growth conditions and the optimum thickness of the intermediate layer, the stress that is put upon the InP layer can be reduced. The laminated structure of compound semiconductors of this example can be made with a large crystal area cheaply by the use of a Si underlying substrate. Moreover, the use of a Si underlying substrate makes the laminated structure of this example tough, so that it is not broken at the time when semiconductor devices are fabricated by the use of the said laminated structure as a substrate.

Example 2

Figure 2:
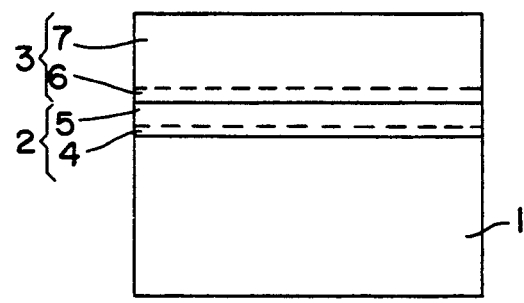
FIG. 2 is a sectional view showing another laminated structure of compound semiconductors of this invention.

FIG. 2 shows another laminated structure of compound semiconductors of this invention, which comprises a Si underlying substrate 1, a GaAs intermediate layer 2, and an InP epilayer 3 in that order. This laminated structure was made by, for example, MOCVD within a reaction chamber under a low pressure of 100-25 Torr. Atmospheric pressure is, of course, applicable to this example.

A Si substrate 1 with a diameter of four inches that was washed with an HF solution in advance was used as an underlying substrate. The Si underlying substrate 1 was then preannealed at 1000° C. for about 10 minutes in an AsH₃ atmosphere. Then, the Si underlying substrate 1 was cooled to 400° C. at which a GaAs intermediate layer 4 having a thickness of 1000 Å or less (preferably 100-1000 Å) was formed, and it was raised to 600° C. at which a GaAs intermediate layer 5 having a thickness of 100-10000 Å was formed, resulting in a GaAs intermediate layer 2. Thereafter, the Si underlying substrate 1 was again cooled to 400° C. at which an InP layer 6 having a thickness of 1000 Å or less was formed, and the temperature of the Si underlying substrate 1 was again elevated to 600° C. at which an InP layer 7 having a thickness of 0.5-10 μm was formed, resulting in an aimed InP layer 3. The conditions under which the source materials used in this example were supplied to the reaction chamber were as follows: Triethylgallium (TEG) and arsine (AsH₃) were used at the time of the formation of the GaAs layer 2, and trimethylindium (TMI) and phosphine (PH₃) were used at the time of the formation of the InP layer 3. The flow rate of a total amount of gases supplied to the reaction chamber used as carrier gas together with H₂ was 15 l/min., wherein the ratio of AsH₃ to TEG was set to be 100 and the ratio of PH₃ to TMI was set to be 70-200 so that the mole fraction of TEG became $2.5 \times 10^{-5}$ and the mole fraction of TMI became $5.6 \times 10^{-5}$.

Example 3

Figure 3:
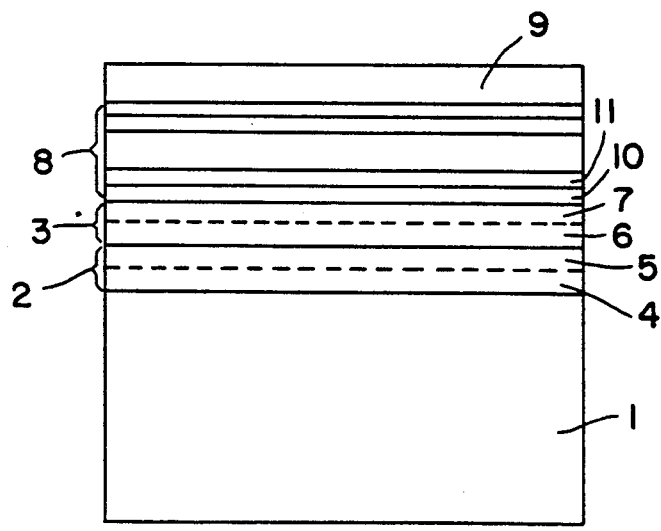
FIG. 3 is a sectional view showing another laminated structure of compound semiconductors of this invention.

FIG. 3 shows another laminated structure of compound semiconductors of this invention, which comprises a IV semiconductor (Si) underlying substrate 1, a first III-V compound semiconductor (GaAs) layer 2 that is composed of a GaAs layer 4 formed at a low temperature, and a GaAs layer 5 formed at a high temperature, a second III-V compound semiconductor (InP) layer 3 that is composed of an InP layer 6 formed at a low temperature, and an InP layer 7 formed at a high temperature, a third III-V compound semiconductor layer 8 that is composed of a plurality of alternate layers consisting of $InAs_xP_{1-x}$ ($0<x<1$) thin layers 10 and InP thin layers 11, and a fourth III-V compound semiconductor (InP) layer 9 in that order.

The laminated structure shown in FIG. 3 was produced as follows: On the Si underlying substrate 1, the first semiconductor layer (i.e., the GaAs intermediate layer) 2 and the second semiconductor layer (i.e., the InP layer) 3 were successively formed in the same way as mentioned in Example 2. Then, on the InP layer 3, $InAs_xP_{1-x}$ thin layers 10 having a thickness of 2.5-100 nm and InP thin layers 11 having a thickness of 2.5-100 nm were alternately formed from 10 to 30 at 600° C., resulting in the third semiconductor layer 8. Then, on the semiconductor layer 8, the fourth semiconductor layer (i.e., the aimed InP epilayer) 9 having a thickness of 2-5 μm was formed at the same temperature. The conditions under which the source materials of this example used for the formation of the GaAs layer 2 and the InP layers 3 and 9 were supplied to the reaction chamber were the same as those of Example 2. The source materials that were used for the formation of the $InAs_xP_{1-x}$ layer 10 were TMI, $AsH_3$, and $PH_3$, wherein the total amount of source gases supplied to the reaction chamber together with $H_2$ used as a carrier gas was 15 l/min., and the ratio of $PH_3$ to TMI was set to be 70-200 so that the concentration of TMI became $5.6 \times 10^{-5}$ mole fraction. With the amount of $AsH_3$ supplied, the ratio of $AsH_3$ to $PH_3$ was set at a fixed level so that the desired value of x could be obtained.

As a result, the InP layer 9 having the very smooth specular surface is formed over the entire surface of the Si underlying substrate with a diameter of 4 inches. The uniformity of the thickness of the InP layer 9 is so excellent that the thickness distribution can be in as small as ±8% or less. It was observed by an optical microscope that no cracks occur even though the thickness of the InP layer 9 is as thin as about 12 μm. This is because the residual stress of the InP layer 9 is at an extremely low level, and thus the laminated structure with the InP epilayer 9 is very useful as a substrate at the time of the fabrication of devices (e.g., LED, FET, etc.) for which a relatively thick thickness is needed. Moreover, when the laminated structure is etched by the use of a solution of HBr and $H_3pO_4$, an InP single crystal epilayer with a single domain is obtained over the entire surface of the Si underlying substrate with a diameter of as large as 4 inches. Pits that are caused by the above-mentioned etching process are located at the portions corresponding to the portions on which crystal defects of the InP layer 9 are located. The etch pit density per a unit area (1 cm²) of the InP layer 9 is $1 \times 10^7$ or less that is remarkably less than that of the InP layer 9, $0.5-2 \times 10^8$, at the time when the InP layer 9 is directly formed on the second semiconductor layer 3 without the third semiconductor layer 8 that is composed of alternate layers consisting of the $InAs_xP_{1-x}$ thin layers 10 and the InP thin layers 11. This means that the use of the third semiconductor layer 8 provides a high quality InP layer 9.

A typical laminated structure of this example was produced as follows: A nominal (100) oriented Si underlying substrate 1 (the thickness thereof being 525 μm) or a tilted, 3° from (100) toward <110>, Si underlying substrate (the thickness thereof being 525 μm) was preannealed at 1000° C. for 10 minutes under 76 Torr in an $H_2$ atmosphere containing $AsH_3$. Then, the Si underlying substrate 1 was cooled to 400° C. at which a GaAs intermediate layer 4 having a thickness of 100 Å raised to 600° C. at which a GaAs intermediate layer 5 having a thickness of 1000 Å was formed on the GaAs intermediate layer 4, resulting in a first semiconductor layer 2. Then, the temperature of the Si underlying substrate 1 was reduced to 400° C. at which an InP layer 6 having a thickness of 200 Å was formed as a buffer layer on the GaAs intermediate layer 5, and the temperature of the Si underlying substrate 1 was again elevated to 600° C. at which an InP layer 7 having a thickness of 2-6 μm was formed on the InP layer 6, resulting in a second semiconductor layer 3. Then, at 600° C., a third semiconductor layer 8 having a thickness of 2000 Å that was composed of alternate layers consisting of five $InAs_{0.1}P_{0.9}$ layers 10 with a thickness of 100 Å each was formed on the second semiconductor layer 3. Then, an aimed InP epilayer 9 having a thickness of 2-8 μm was formed on the third semiconductor layer 8 at 600° C., resulting in a laminated structure of compound semiconductors. The InP epilayer of this laminated structure has a crystal defect density of $1 \times 10^7$ or less. In this way, the crystal defects of the aimed growth layer can be decreased, and thus a laminated III-V compound semiconductor structure with a high quality, a low stress, and an excellent smoothness is obtainable on a Si underlying substrate with a diameter of as large as 4 inches.

As mentioned above, in the case where a III-V semiconductor (e.g., InP) layer that has a great lattice-mismatch with regard to IV group semiconductors such as Si is formed on a IV group semiconductor underlying substrate, when another III-V compound semiconductor (e.g., GaAs, etc.,) that attains a well lattice-match with both the IV semiconductor such as Si and the aimed crystal growth layer of a III-V compound semiconductor is used as an intermediate layer, and when the thermal expansion coefficients of the underlying substrate, $E_{ts}$, the intermediate layer, $E_{tl}$, and the aimed crystal growth layer, $E_{t2}$, have the following relationship: $E_{t1} > E_{t2} > E_{ts}$, a laminated structure of III-V compound semiconductors that has a very smooth and very high quality crystal-epilayer can be obtained.

Moreover, in the laminated structure of compound semiconductors of this invention, when alternate layers consisting of $InAs_xP_{1-x}$ thin layers and InP thin layers are used, the crystal defects arising from the large lattice mismatch between the IV semiconductor underlying substrate and the III-V semiconductor layer can be effectively decreased, and accordingly, the laminated compound semiconductor structure that is provided with a high quality III-V group semiconductor layer such as an InP can be obtained at a low cost. Moreover, by the use of a Si underlying substrate, the laminated structure can be provided with a large crystal area. In the case where a Si underlying substrate that is relatively hard is used, the resulting laminated structure of compound semiconductors can be easily handled when it is used as a substrate for the fabrication of semiconductor devices or the like.

The laminated structure of this invention is not limited to the above-mentioned examples, but it can be produced by the use of, for example, Ge as a IV group semiconductor underlying substrate and GaP as an intermediate layer.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A laminated structure of compound semiconductors comprising a IV semiconductor underlying substrate, a first III-V compound semiconductor layer that is formed as an intermediate layer on said IV compound semiconductor underlying substrate, and a second III-V compound semiconductor layer that is formed on said intermediate layer, wherein the thermal expansion coefficients of said IV compound semiconductor underlying substrate, $E_{ts}$, said first III-V compound semiconductor layer, $E_{t1}$, and said second III-V compound semiconductor layer, $E_{t2}$, have the following relationship: $E_{t1} > E_{t2} > E_{ts}$.

2. A laminated structure of compound semiconductors according to claim 1, wherein said IV compound semiconductor underlying substrate is made of Si, said first III-V compound semiconductor layer is made of GaAs, and said second III-V compound semiconductor layer is made of InP.

3. A laminated structure of compound semiconductors according to claim 2, which further comprises a third III-V compound semiconductor layer that is formed on said second III-V compound semiconductor layer, said third III-V compound semiconductor being composed of a plurality of alternate layers consisting of compound semiconductor thin layers made of the same compound semiconductor as said second III-V compound semiconductor layer and III-V compound semiconductor thin layers made of a compound semiconductor different from that of said second III-V compound semiconductor layer; and a fourth compound semiconductor layer that is formed on said third III-V compound semiconductor layer.

4. A laminated structure of compound semiconductors according to claim 3, wherein said third III-V compound semiconductor layer is composed of a plurality of alternate layers consisting of $InAs_xP_{1-x}$ ($0<x<1$) thin layers and InP thin layers, and said fourth III-V compound semiconductor layer is made of InP.

5. A laminated structure of compound semiconductors according to claim 4, wherein said third III-V compound semiconductor layer is composed of alternate layers consisting of about thirty or less $InAs_xP_{1-x}$ layers and InP layers with a thickness of about 100 nm or less each.

6. A laminated structure of compound semiconductors according to claim 1, wherein the first III-V compound semiconductor layer and the second III-V compound semiconductor layer that is formed on said first III-V compound semiconductor layer, respectively, contain a compound semiconductor layer with a thickness of 1000 Å or less that is formed at a low temperature of 300°–450°C.

* * * * *